United States Patent [19]

Parekh

[11] 4,307,307

[45] Dec. 22, 1981

[54] BIAS CONTROL FOR TRANSISTOR CIRCUITS INCORPORATING SUBSTRATE BIAS GENERATORS

[76] Inventor: Rajesh H. Parekh, 176 Sun Blossom Dr., San Jose, Calif. 95123

[21] Appl. No.: 65,316

[22] Filed: Aug. 9, 1979

[51] Int. Cl.[3] ...................... H03L 1/00; H03K 3/353; H03K 17/14

[52] U.S. Cl. .................................... 307/297; 307/304; 307/568

[58] Field of Search .................... 307/200 B, 297, 304, 307/568

[56] References Cited

U.S. PATENT DOCUMENTS

| | | | |
|---|---|---|---|
| 3,794,862 | 2/1974 | Jenne | 307/304 |
| 3,806,741 | 4/1974 | Smith | 307/304 |
| 4,049,980 | 9/1977 | Maitland | 307/304 |
| 4,115,710 | 9/1978 | Lou | 307/297 X |
| 4,142,114 | 2/1979 | Green | 307/297 X |
| 4,208,595 | 6/1980 | Gladstein et al. | 307/297 |
| 4,229,667 | 10/1980 | Heimbigner et al. | 307/297 |

OTHER PUBLICATIONS

Frantz, "Threshold Voltage Control Forn-Channel MOSFET Devices"; IBM Tech. Discl. Bull.; vol. 12, No. 12, p. 2078; 5/1970.

Hummel, "Sentry Circuit for Substrate Voltage Control"; *IBM Tech. Discl. Bull.;* vol. 15, No. 2, pp. 478–479, 7/1972.

Chang, "FET N-Channel Threshold Voltage-Control Circuit"; *IBM Tech. Discl. Bull.;* vol. 17, No. 1, p. 140; 6/1974.

*Primary Examiner*—Larry N. Anagnos
*Attorney, Agent, or Firm*—Paul J. Winters; Theodore S. Park; Kevin McMahon

[57] ABSTRACT

Control circuitry for sensing excessive substrate bias voltage in a circuit, such as an LSI N-channel MOS transistor circuit incorporating a substrate bias generator, and for maintaining an optimum bias voltage level by bypassing the excess to ground.

9 Claims, 3 Drawing Figures

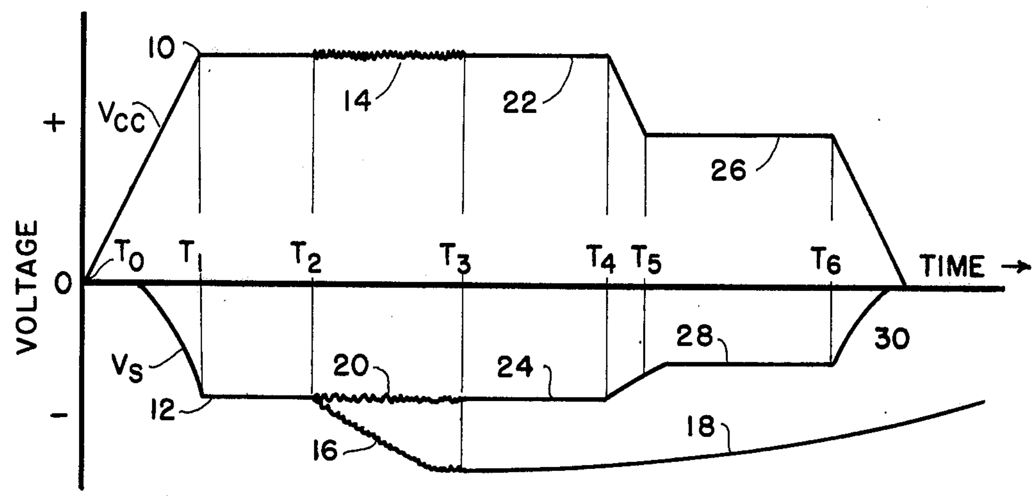
FIG. 1
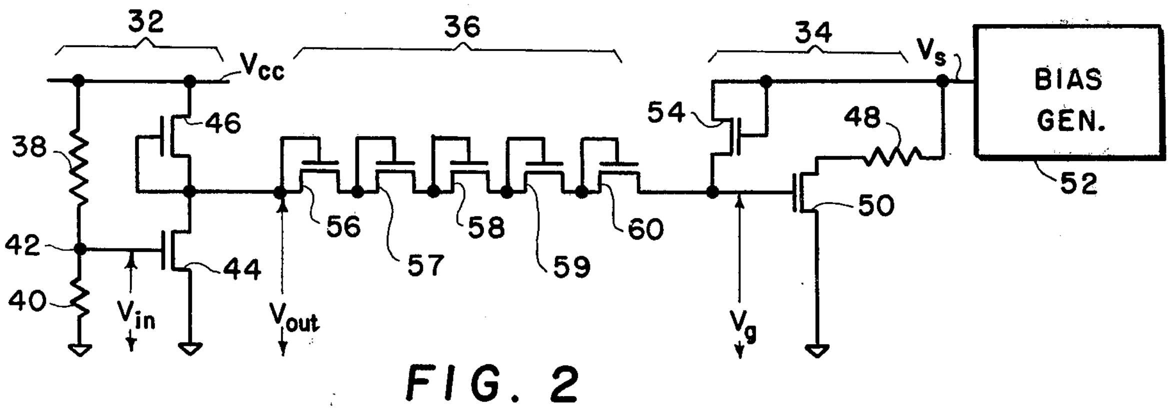
FIG. 2
| $V_{cc}$ | $V_{in}$ | $V_s$ | $V_{t44}$ | 44 | $V_{out}$ | $V_g$ | 50 |
|---|---|---|---|---|---|---|---|
| 4.0 | 0.4 | -2.0 | 0.4 | — | — | — | — |
| | | -3.0 | 0.5 | OFF | 4 | +0.5 | ON |
| | | -4.0 | 0.6 | OFF | 4 | +0.5 | ON |
| 5.0 | 0.5 | -2.0 | 0.4 | ON | 0 | -2 | OFF |
| | | -3.0 | 0.5 | — | — | — | — |
| | | -4.0 | 0.6 | OFF | 5 | +1.5 | ON |
| 6.0 | 0.6 | -2.0 | 0.4 | ON | 0 | -2 | OFF |
| | | -3.0 | 0.5 | ON | 0 | -3 | OFF |
| | | -4.0 | 0.6 | — | — | — | — |
— = UNPREDICTABLE
FIG. 3

BIAS CONTROL FOR TRANSISTOR CIRCUITS INCORPORATING SUBSTRATE BIAS GENERATORS

BRIEF SUMMARY OF THE INVENTION

This invention relates to voltage control circuits and particularly to control circuitry that senses and limits the bias voltage applied to substrates of transistor circuitry.

Most transistor circuits, such as MOS transistor circuits, require a negative bias voltage applied to the circuitry substrate. For large scale circuits, it is a recent development to incorporate an on-chip bias voltage generator, thus enabling the condensation of an entire MOS device into one discrete chip requiring only a single input supply voltage terminal. In the typical N-channel transistor circuit board, a bias generator is required to provide a negative voltage of, for example, two to four volts on the substrate bias.

The required bias voltage for a circuit is roughly proportional to the applied $V_{cc}$ supply voltage. For example, a maximum operating supply voltage of six volts may require negative substrate bias voltage of four volts, whereas a minimum supply voltage of four volts may require a lower negative bias voltage of perhaps three volts for proper operation of the associated transistor circuits. Unfortunately, when the transistors and associated circuitry are dynamically operated by subjecting them to on-off switching at a relatively high frequency, some of the components subjected to the switching will become more negative than the substrate and will therefore inject electron charges into the substrate to thereby increase the negative bias level on the substrate. The resulting increased bias results in a detrimental reduction in the transistor drain current by effectively pinching off the channels between the transistor depletion layers, that is, the results are essentially the same as a reduction of the control voltage on the gate element toward the point of transistor cutoff.

The substrate voltage generator incorporated in a circuit chip operates from the $V_{cc}$ input supply voltage applied to the chip and, as previously mentioned, produces a negative bias voltage which, within the $V_{cc}$ operating range, is approximately proportional to the $V_{cc}$ level. The bias control circuitry of the invention therefore measures the $V_{cc}$ supply voltage level and applies a voltage input signal of approximately one-tenth the measured level to a gating or sensing circuit, the conduction threshold of which is dependent upon the level of the substrate bias. If the sensing circuit input of one-tenth $V_{cc}$ is greater than the conduction threshold level, the sensing circuit will produce an output at zero or ground level; if lower than the threshold, the output is at the level of $V_{cc}$.

The sensing circuit output operates to switch a bias voltage control element including a series resistor and transistor switch between the bias voltage output pad or conductor and ground reference. When rendered conductive by the $V_{cc}$ output level of the sensing circuit, the control element will provide a relatively low resistance path to ground to both rapidly bleed off the injected charges that increase the bias above a proper operating level and also to provide the desired rapid bias level decay if the $V_{cc}$ level should drop from its high operating level of perhaps six volts to its low operating level of approximately four volts. The control circuitry therefore includes a sensing circuitry that measures $V_{cc}$ and the bias voltage level, a control element that provides a relatively low resistance path from the bias generator to ground when the bias voltage level becomes excessive, and also translation circuitry between the sensing circuitry and the control element for translating the output voltage of the sensing circuitry to the proper input level of the control element,

DESCRIPTION OF THE DRAWINGS

In the drawings that illustrate the preferred embodiment of the invention:

FIG. 1 is a diagram illustrating typical $V_{cc}$ and corresponding substrate voltages plotted against various time cycles;

FIG. 2 is a schematic diagram of the bias control circuitry of the invention; and FIG. 3 is a table illustrating the operation of the circuitry of FIG. 2.

DETAILED DESCRIPTION OF THE PREFERRED EMBODIMENT

As previously mentioned, on-chip bias voltage generators that provide the necessary negative voltage to the substrate, or back gate of MOS transistor circuit chips, operate from the $V_{cc}$ supply voltage applied to the chip and for proper operation of the transistor circuits on the chip, the substrate bias voltage generator may produce negative voltage levels between approximately two volts and three volts when the $V_{cc}$ supply voltage correspondingly varies between its minimum and maximum operating levels of approximately four and six volts, respectively.

FIG. 1 is a plot of substrate bias voltage, $V_s$, for various conditions of the supply voltage, $V_{cc}$. When $V_{cc}$ is initially applied to the circuit chip at a time, $T_0$, it rapidly rises to its full value which may be its maximum opeating level 10 occurring at time, $T_1$. When the rising $V_{cc}$ voltage reaches a level of approximately 2.5 volts, the substrate generator may begin to produce its negative bias voltage, $V_s$, which increases slightly nonlinearly to a proper level of perhaps $-4$ volts indicated by the reference numeral 12 at time $T_1$. If the associated transistor circuitry was not operated in a dynamic mode, both $V_{cc}$ and $V_s$ would maintain their levels as indicated by the section of the plotted curves between times $T_1$ and $T_2$.

When a circuit chip, such as a microprocessor chip, is in operation, the $V_{cc}$ load changes as indicated by the ripple section 14 between times $T_2$ and $T_3$. During the operation of the chip, the various N and P silicon layers of each transistor form capacitances with the transistor gate material being subjected to rapid voltage variations generally between $V_{cc}$ and $V_s$ levels. When the N+ polysilicon drops to its low level, it will be driven more negative than the level of the substrate with the result that it will inject charges into the substrate and drive the substrate voltage to a level lower than the optimum bias as indicated by the section 16 of the $V_s$ waveform of FIG. 1. As previously mentioned, this increased bias tends to pinch off conduction of the transistors. Furthermore, since there is an extremely low substrate leakage current, this excessive substrate bias voltage decays at a very slow rate even after $V_{cc}$ has been terminated as indicated by the curve 18 of FIG. 1.

The circuitry of the invention eliminates the deleterious effects of substrate charge injection so that at time, $T_2$, when such injection would normally take place, the control circuit will maintain a relatively constant level of $V_s$ as indicated by the section 20 of FIG. 1. If it is assumed that dynamic operation of the chip is stopped at between times $T_3$ and $T_4$, $V_{cc}$ will return to its normal level as indicated by the section 22 and the $V_s$ curve will remain at its constant desired level as indicated by the section 24.

If the externally applied $V_{cc}$ supply voltage is lowered at time $T_4$ to its low operating level 26 at time $T_5$, the control circuit will provide the necessary low resistance current path to reduce the bias voltage $V_s$ to its low operating level 28 very shortly after $V_{cc}$ attains its low level 26. And if $V_{cc}$ is turned off at time $T_6$, the control circuit will rapidly discharge the substrate charges to reduce the level of $V_s$ to zero as indicated by the curved section 30.

FIG. 2 is a schematic diagram of the preferred embodiment of the control circuitry of the invention and is comprised of sensing circuitry 32, a control element 34 and translation circuitry 36 that translates the output voltage of the sensing circuitry 32 to the proper input level of the control element 34. Sensing circuitry 32 samples the level of $V_{cc}$, compares it with the bias voltage level and generates an output whenever the sampled $V_{cc}$ level exceeds the $V_s$ level.

Sensing circuitry 32 includes a voltage divider between $V_{cc}$ and ground reference. The voltage divider includes a resistance 38 coupled to a $V_{cc}$ source and in series with a resistance 40 connected to ground. The values of resistors 38 and 40 should be such that a voltage of approximately ten percent of $V_{cc}$ is produced at their junction 42. The junction 42 is connected to the gate of a transistor 44, the source of which is at ground potential and the drain of which is connected to the source of a heavy depletion transistor 46. The drain of transistor 46 is coupled to a conductor carrying the $V_{cc}$ supply voltage and its gate element is connected to its source and the output terminal of the sensing circuit 32. It will be recognized that the series transistors 44 and 46 form a conventional inverter circuit and also that the input voltage, $V_{in}$, that is ten or eleven percent of $V_{cc}$, is very nearly equal to the normal threshold voltage, $V_t$, of the transistor 44. As will be later discussed in connection with FIG. 3, the output voltage, $V_{out}$, of the sensing circuitry 32, taken from the interconnection of transistors 44 and 46 will vary between zero and $V_{cc}$.

The control element 34 is essentially a current bypass circuit including a resistor 48 in series with the transistor switch 50 respectively connected between an output conductor of the substrate bias generator 52 and ground potential. A transistor 54, which may be either a heavy or a light depletion load transistor, is connected between the output of the substrate bias generator 52 and the gate of the transistor 50. The gate of transistor 54 is coupled back to its source and the generator 52 so that transistor 54 operates as a series diode-resistance which, in the absence of any other input signals, will maintain a negative bias voltage on the gate of transistor 50, thereby rendering it non-conductive.

When non-conductive, transistor 50 has the substrate bias voltage level applied to its drain element and also to its gate element. Transistor 50 will become conductive when the control voltage applied to its gate becomes more positive, or less negative, than its drain voltage. The translating circuitry 36 translates the zero and $V_{cc}$ output of the sensing circuitry 32 into a gate voltage, $V_g$, that will appropriately switch transistor 50 between its conductive and non-conductive states. In the preferred embodiment, the translation circuitry 36 comprises a series array of five enhancement transistors 56, 57, 58, 59 and 60. The source of each transistor is connected to the drain of each previous transistor to form the series array and the gate element of each of the transistors 56–60 is connected to its own drain element so that the transistors become diodes forward biased between the sensing circuitry 32 and the control element 34. The purpose of the diode string 56–60 is to reduce the output voltage $V_{out}$, when at the $V_{cc}$ level, to a proper gate voltage, $V_g$, that will control the switching transistor 50. If each of the diode-connected transistors 56–60 has a normal threshold voltage of 0.7 volts, the translation circuitry 36 will provide a 3.5 volt drop between $V_{out}$ and $V_g$.

The translation circuitry 36 illustrated in FIG. 2 is the preferred embodiment since it is very simple to deposit on a circuit board chip. It must be understood that other translation circuits will also provide the necessary voltage level transferred between the sensing circuitry 32 and the control element 34. For example, the control element 34 may be properly operated by substituting a translation circuitry comprising a single capacitor. In this configuration, the transistor 54 may be eliminated and an enhancement transistor should be diode connected with the drain and gate elements coupled to the gate of transistor 50 and the source element at ground. In such a configuration, the transistor 50 is normally non-conductive and a high level $V_{out}$ will cause a corresponding positive jump in $V_g$ to render transistor 50 conductive. When $V_{out}$ drops to its low level, or zero volts, the capacitor plate on the control circuit side will discharge through the diode to ground, thereby permitting transistor 50 to become non-conductive.

FIG. 3 is a table illustrating the various levels and conditions of the circuitry of FIG. 2 at different values of $V_{cc}$ supply voltage and of the substrate voltage $V_s$. If the externally supplied $V_{cc}$ level is 4.0 volts, the voltage divider resistors 38 and 40 supply a $V_{in}$ of 0.4 volts to the gate of transistor 44. The transistor 44 is a component part of the circuit chip and is subjected to the substrate voltage $V_s$. The conduction threshold $V_t$ of transistor 44 varies according to the substrate bias voltage, $V_s$. Thus, if $V_s$ is −2.0 volts, −3.0 volts, or −4.0 volts, the threshold voltage $V_t$, of the transistor 44 may respectively vary between 0.4 volts, 0.5 volts, or 0.6 volts. Transistor 44 compares $V_{in}$ with $V_t$. If $V_{in}$ is more positive than $V_t$, transistor 44 conducts to produce a $V_{out}$ of zero volts. Whenever $V_{in}$ is less positive than $V_t$, transistor 44 is off, thereby lifting its output conductor from ground and producing $V_{out}$ substantially equal to $V_{cc}$. When $V_{in}$ is substantially equal to $V_t$, the conduction of transistor 44 is unpredictable and varies between its on and off state to produce a $V_{out}$ that correspondingly varies between zero and $V_{cc}$ as indicated by the dash in the top of the "44" column of FIG. 3.

The translation circuitry 36 comprising the series string of diode-connected transistors 56–60 is forward biased to provide a voltage drop of 3.5 volts when $V_{out}$ is equal to $V_{cc}$. Therefore, when $V_{cc}$ is equal to 4.0 volts, and transistor 44 is not conducting, $V_g$ will be equal to 4.0 volts less the drop in the translation circuitry 36, or 0.5 volts. Since this voltage is more positive than the lowest voltage appearing on the source or drain of transistor 50, transistor 50 will turn on to bypass charges from the substrate, thereby lowering the substrate bias voltage. If, on the other hand, $V_{in}$ is more positive than $V_t$ and transistor 44 is on, $V_{out}$ will be set at ground or zero volts and the difference between $V_{out}$ and the substrate bias level $V_s$ that normally applied to the non-conducting transistor 50, will be insufficient to permit conduction through the translation circuitry 36. Therefore, $V_g$ will remain unchanged at the $V_s$ level to maintain transistor 50 in its off condition.

FIG. 3 illustrates various voltage levels and transistor conduction conditions for three values of supply voltage, $V_{cc}$ and substrate bias, $V_s$. The vertical columns labeled 44 and 50 indicate the ON, the OFF, or the varying unpredictable switching conditions of the transistors 44 and 50. It will be noted that whenever $V_{in}$ is more positive than $V_t$, at any level of $V_{cc}$, transistor 44 is on and transistor 50 is off. Whenever $V_{in}$ is less positive than $V_t$, transistor 44 is off and transistor 50 is on to provide the charge bypass that permits the bias voltage to follow the desired response curve illustrated by the sections 20, 24, 28 and 30 of FIG. 1. Whenever the level of $V_{in}$ is substantially equal to $V_t$, transistor 44 will rapidly and unpredictably vary between an on and off condition and transistor 50 will vary off and on, respectively, as indicated by the dashes in the table of FIG. 3.

Having thus described my invention, what is claimed is:

1. Control circuitry for limiting bias voltage levels at the substrate of a transistor circuit chip, said control circuitry comprising:

sensing circuitry means responsive to variations in the circuit chip supply voltage level and to the chip substrate bias voltage level for producing an output signal corresponding to said supply voltage level whenever said bias voltage exceeds a predetermined level for a particular level of said supply voltage;

a switching transistor in series with a resistance coupled between a bias voltage conductor and ground reference, said switching transistor being responsive to the occurrence of said output signal for coupling said conductor with said ground reference; and a resistive element coupled between said bias voltage conductor and the control element of said switching transistor for maintaining said transistor in a normally non-conductive state in the absence of said output signal.

2. The control circuitry claimed in claim 1 further including translation circuitry coupled between the output terminal of said sensing circuitry means and the control element of said switching transistor for translating said output signal into a control gate voltage for switching said switching transistor.

3. The control circuitry claimed in claim 1 wherein said sensing circuitry means includes a transistor inverter comprising first and second series transistors coupled between a circuit chip supply voltage conductor and ground reference, said first and second transistors being constructed on said circuit chip and being subjected to said substrate bias voltage.

4. The control circuitry claimed in claim 3 wherein said sensing circuitry means further includes a voltage divider circuit between said circuit supply voltage and said ground reference, said voltage divider being tapped to provide an input signal to said first transistor of said inverter that is approximately one-tenth the level of said chip supply voltage.

5. The control circuitry claimed in claim 4 wherein said inverter responds to said input voltage signal and to said bias voltage level to produce a high level output signal whenever said input voltage signal is less positive than the conduction threshold voltage level of said first transistor.

6. The control circuitry claimed in claim 5 wherein said inverter produces an output signal at a high level substantially equal to said chip supply voltage level, said output signal being substantially at ground reference in the absence of said high level output signal.

7. The control circuitry claimed in claim 6 further including translation circuitry coupled between the output of said inverter and the gate electrode of said control element of said switching transistor, said translating circuitry providing switching transistor gate voltage levels that will turn on said switching transistor at said high level output signal and will permit said bias voltage level to retain said switching transistor in a non-conductive state at low ground reference output levels of said inverter.

8. The control circuitry claimed in claim 7 wherein said translation circuitry includes a plurality of diode connected transistors in series, the quantity of transistors in said plurality being sufficient to render said translation transistors non-conductive at voltage level differences between said low level ground reference output signal and said bias voltage level at said non-conductive switching transistor, and for translating said high level output signals into a conduction producing control gate signal at said switching transistor.

9. The control circuitry claimed in claim 7 wherein said translation circuitry includes a capacitor coupled between the output terminal of said inverter and the gate of said switching transistor, said translation circuitry further including a diode connected transistor between the gate of said switching transistor and ground reference for discharging said capacitor in the absence of a high level output signal from said inverter.

* * * * *